(12) United States Patent
Rieh et al.

(10) Patent No.: US 10,523,217 B2
(45) Date of Patent: Dec. 31, 2019

(54) FREQUENCY LOCKED LOOP OF A HETERODYNE STRUCTURE

(71) Applicant: KOREA UNIVERSITY RESEARCH AND BUSINESS FOUNDATION, Seoul (KR)

(72) Inventors: Jae-Sung Rieh, Seoul (KR); Jung Soo Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/233,452

(22) Filed: Dec. 27, 2018

(65) Prior Publication Data

US 2019/0238140 A1    Aug. 1, 2019

(30) Foreign Application Priority Data

Jan. 29, 2018 (KR) .................. 10-2018-0010531

(51) Int. Cl.
  *H03L 7/087* (2006.01)
  *H04B 1/26* (2006.01)
  *H03L 7/187* (2006.01)

(52) U.S. Cl.
  CPC .............. *H03L 7/087* (2013.01); *H03L 7/187* (2013.01); *H04B 1/26* (2013.01)

(58) Field of Classification Search
  CPC ......... H03L 7/087; H03L 7/187; H03L 7/099; H04B 1/26
  See application file for complete search history.

(56) References Cited

U.S. PATENT DOCUMENTS

| 5,212,554 A * | 5/1993 | Tults ................. H03J 7/065 348/732 |
| 2003/0235258 A1* | 12/2003 | Kenney .............. H04L 27/0014 375/344 |

OTHER PUBLICATIONS

Huang et al., A 60 GHz Antenna-Referenced Frequency-Locked Loop in 0.13 μm CMOS for Wireless Sensor Networks, IEEE Journal of Solid-State Circuits, Dec. 2011, pp. 2956-5965, vol. 46, No. 13, IEEE, New York City, U.S.

Yoon et al., D-Band Heterodyne Integrated Imager in a 65-nm CMOS Technology, IEEE Microwave and Wireless Components Letters, Mar. 2015, pp. 196-198, vol. 25, No. 3, IEEE, U.S.

Korean Office Action dated Mar. 20, 2019 in connection with the counterpart Korean Patent Application No. KR 10-2018-0010531.

* cited by examiner

*Primary Examiner* — Vineeta S Panwalkar
(74) *Attorney, Agent, or Firm* — Hauptman Ham, LLP

(57) ABSTRACT

A frequency locked loop is disclosed. The disclosed frequency locked loop may include: a voltage-controlled oscillator configured to output a LO signal; a mixer configured to mix an RF signal with the LO signal to output an IF signal; a first IF path part configured to transfer the IF signal; a second IF path part configured to transfer the IF signal; and an error amplifier configured to receive output signals of the first IF path part and output signals of the second IF part as input, where the voltage-controlled oscillator adjusts a frequency of the LO signal based on an output signal of the error amplifier, the first IF path part has the conversion gain decreased according to an increase in the frequency of the IF signal, and the second IF path part has the conversion gain increased according to an increase in the frequency of the IF signal.

5 Claims, 3 Drawing Sheets

FREQUENCY LOCKED LOOP OF A HETERODYNE STRUCTURE

CROSS-REFERENCE TO RELATED APPLICATIONS

This application claims the benefit of Korean Patent Application No. 10-2018-0010531, filed with the Korean Intellectual Property Office on Jan. 29, 2018, the disclosure of which is incorporated herein by reference in its entirety.

BACKGROUND

1. Technical Field

Embodiments of the present invention relate to a frequency locked loop, more particularly to a frequency locked loop of a heterodyne structure for locking the frequency of a voltage-controlled oscillator.

2. Description of the Related Art

High frequency bands can be utilized in various fields, such as imaging, spectroscopy, biochemical detection, astronomy, and broadband communication. There is growing interest in such frequency bands, and researchers are motivated to implement systems based on semiconductor elements due to the advantages of small size, low cost, low power consumption, etc.

An imaging receiver terminal for a high frequency band may be composed of a direct detection structure and a heterodyne structure. The direct detection structure has the advantages of consuming less power and occupying a small area. The heterodyne structure consumes more power, occupies a larger area, and entails a more complicated design compared to the direct detection structure but provides the advantage of superior performance. FIG. 1 illustrates the structure of a conventional heterodyne receiver.

To increase the detection speed of an image, an array receiver terminal with a high resolution is required. If a heterodyne receiver structure is used for the array receiver terminal, the phase noise of the LO (local oscillator) signal for each pixel has to be low. Otherwise, as an error may occur with each instance of output values for the pixels, the resulting noise may become large. Methods for decreasing the phase noise of LO signals include methods that use the phase locked loop and the frequency multiplier chain.

Since the area per pixel of the array receiver terminal decreases with an increase in the frequency band, the receiver terminal has to be made small so as to be integrated in the area of each pixel. When an array receiver terminal is implemented in a heterodyne structure, there is a difficulty in integrating each heterodyne receiver in each pixel, as using a phase locked loop or a frequency multiplier chain occupies additional area.

SUMMARY OF THE INVENTION

To resolve the problems in the related art described above, an aspect of the present invention proposes a frequency locked loop of a heterodyne structure that minimizes the number of additional components to enable easy stacking over the area of each pixel of an array receiver terminal.

Other objectives of the invention can be derived by the person skilled in the art from the embodiments set forth below.

An embodiment of the invention, conceived to achieve the objectives above, provides a frequency locked loop that includes: a voltage-controlled oscillator configured to output a LO signal; a mixer configured to mix an RF signal with the LO signal to output an IF signal; a first IF path part configured to transfer the IF signal; a second IF path part configured to transfer the IF signal; and an error amplifier configured to receive output signals of the first IF path part and output signals of the second IF part as input, where the voltage-controlled oscillator adjusts a frequency of the LO signal based on an output signal of the error amplifier, the first IF path part has a decrease in conversion gain according to an increase in the frequency of the IF signal, and the second IF path part has an increase in conversion gain according to a decrease in the frequency of the IF signal.

The first IF path part and the second IF path part can be connected in parallel with respect to the output end of the mixer.

The first IF path part can include a LPF (low-pass Filter), and the second IF path part can include a HPF (high-pass filter).

The first IF path part can include an amplifier matched to a low-frequency band, and the second IF path part can include an amplifier matched to a high-frequency band.

Another embodiment of the invention provides a frequency locked loop that includes: a voltage-controlled oscillator configured to output a LO signal: a mixer configured to mix an RF signal with the LO signal to output an IF signal; a first IF path part configured to transfer the IF signal: a second IF path part configured to transfer the IF signal; an error amplifier configured to receive output signals of the first IF path part and output signals of the second IF part as input; an integrator configured to integrate an output signal of the error amplifier: and a loop filter configured to receive an output signal of the integrator as input, where an output signal of the loop filter is injected to the voltage-controlled oscillator, the first IF path part has a decrease in conversion gain according to an increase in the frequency of the IF signal, and the second IF path part has an increase in conversion gain according to a decrease in the frequency of the IF signal.

An embodiment of the invention can minimize the number of additional components, thereby providing the advantage of enabling easier stacking over the area of each pixel of an array receiver terminal.

Additional aspects and advantages of the present invention will be set forth in part in the description which follows, and in part will be obvious from the description, or may be learned by practice of the invention.

DETAILED DESCRIPTION OF THE INVENTION

Figure 1:
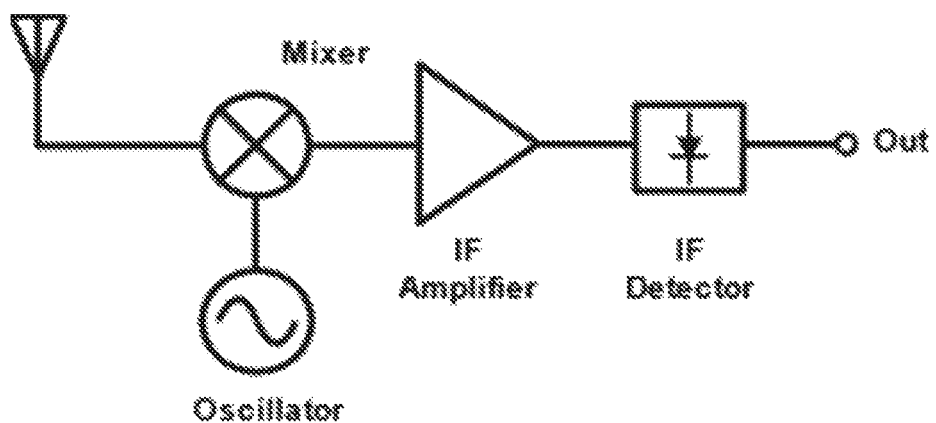
FIG. 1 illustrates the structure of a conventional heterodyne receiver.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, similar reference numerals are assigned to similar elements.

While such terms as "first" and "second," etc., may be used to describe various elements, such elements must not be limited to the above terms. The above terms are used only to distinguish one element from another. For example, a first element may be referred to as a second element without departing from the scope of rights of the present invention, and likewise a second element may be referred to as a first element. The term "and/or" encompasses both combinations of the plurality of related items disclosed and any item from among the plurality of related items disclosed.

When an element is mentioned is being "connected" or "coupled" to another element, it is to be understood that, while the element can be directly connected or coupled to the other element, it is also possible that another element may be interposed therebetween. On the other hand, if an element is mentioned as being "directly connected" or "directly coupled" to another element, it is to be understood that there are no other elements in-between.

A detailed description of certain embodiments of the invention is provided below with reference to the accompanying drawings.

Figure 2:
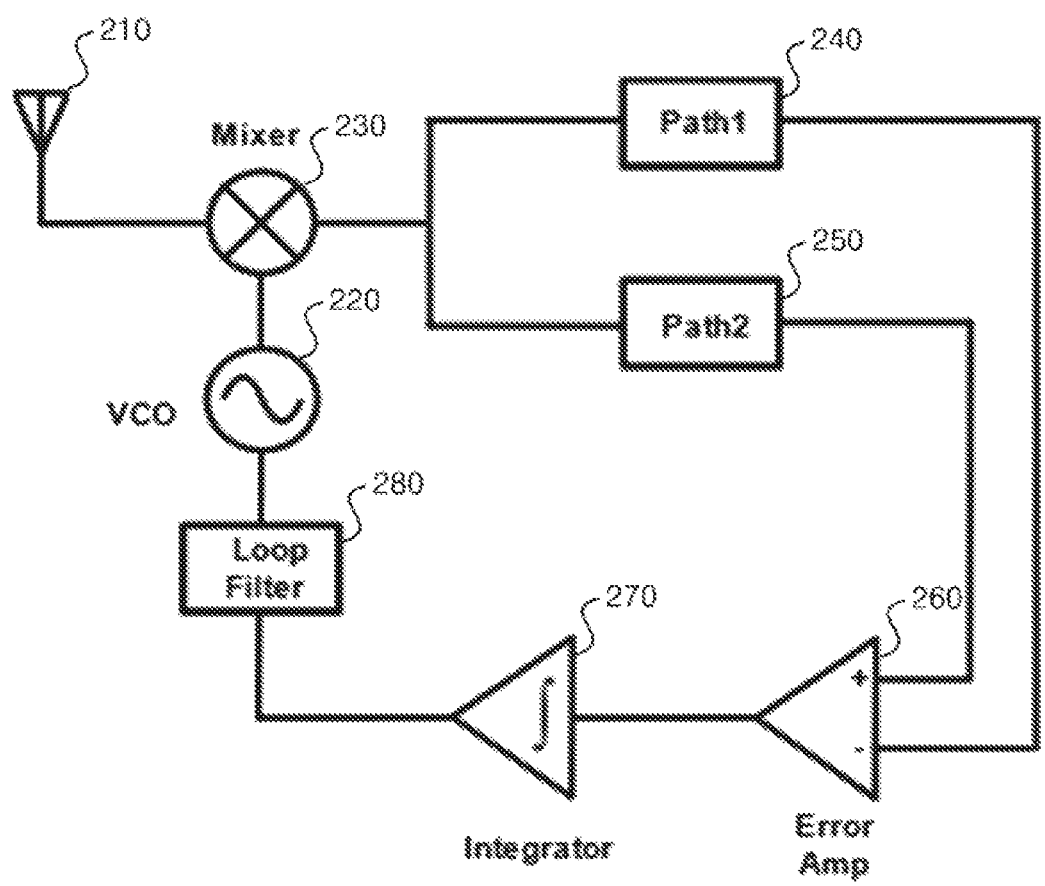
FIG. 2 schematically illustrates the composition of a frequency locked loop according to an embodiment of the invention.

FIG. 2 schematically illustrates the composition of a frequency locked loop according to an embodiment of the invention.

Referring to FIG. 2, a frequency locked loop 200 according to an embodiment of the invention may be a frequency locked loop of a heterodyne structure and may include a receiver part 210, a voltage-controlled oscillator (VCO) 220, a mixer 230, a first IF path part 240, a second IF path part 250, an error amplifier 260, an integrator 270, and a loop filter 280.

The receiver part 210 may receive an outside RF (radio frequency) signal, and the voltage-controlled oscillator 220 may output a LO (local oscillator) signal.

The mixer 230 may have the input ends connected to the receiver part 210 and the voltage-controlled oscillator 220 and may mix the RF signal outputted from the receiver part 210 with the LO signal outputted from the voltage-controlled oscillator 220 to output an IF (intermediate frequency) signal.

For example, the frequency of the IF signal can be expressed as Equation 1 shown below.

$$f_{IF} = f_{RF} - N \times f_{LO} \quad \text{[Equation 1]}$$

Here, $f_{IF}$ is the frequency of the IF signal, $f_{RF}$ is the frequency of the RF signal, $f_{LO}$ is the frequency of the LO signal, and N is a natural number. For instance, in cases where the mixer 230 is a fundamental mixer, N can have a value of "1", and in cases where the mixer 230 is a subharmonic mixer, N can have a value of "2" or "3", etc.

The first IF path part 240 and the second IF path part 250 may transfer the IF signal. Here, the first IF path part 240 and the second IF path part 250 may be connected in parallel with respect to the output end of the mixer 230.

According to an embodiment of the invention, the first IF path part 240 may form a path of which the conversion gain is decreased according to an increase in the frequency of the IF signal, whereas the second IF path part 250 may form a path of which the conversion gain is increased according to an increase in the frequency of the IF signal.

According to an embodiment of the invention, the first IF path part 240 can include a LPF (low-pass filter), and the second IF path part 250 can include a HPF (high-pass filter).

Also, according to another embodiment of the invention, the first IF path part 240 can include an amplifier matched to a low frequency band, whereas the second IF path part 250 can include an amplifier matched to a high frequency band.

The error amplifier 260 may receive the output signal of the first IF path part 240 and the output signal of the second IF path part 250 as input and may compare the difference between the gain of the first IF path part 240 and the gain of the second IF path part 250.

For instance, if the gain of the first IF path part 240 is smaller than the gain of the second IF path part 250, the error amplifier 260 may output a positive value, and if the gain of the first IF path part 240 is greater than the gain of the second IF path part 250, the error amplifier 260 may output a negative value.

The integrator 270 may integrate the output signal of the error amplifier 260, and the loop filter 280 may receive the output signal of the integrator 270 as input and transform the signal into a voltage. The output signal of the loop filter 280 may be injected to the voltage-controlled oscillator 220, and the voltage-controlled oscillator 220 may adjust the frequency of the LO signal based on the voltage outputted from the loop filter 280.

In other words, the voltage-controlled oscillator 220 may adjust the frequency of the LO signal based on the voltage output from the loop filter 280, or the output signal of the error amplifier 260. The concept of adjusting the frequency of the LO signal is described below in further detail with reference to FIG. 3.

Figure 3:
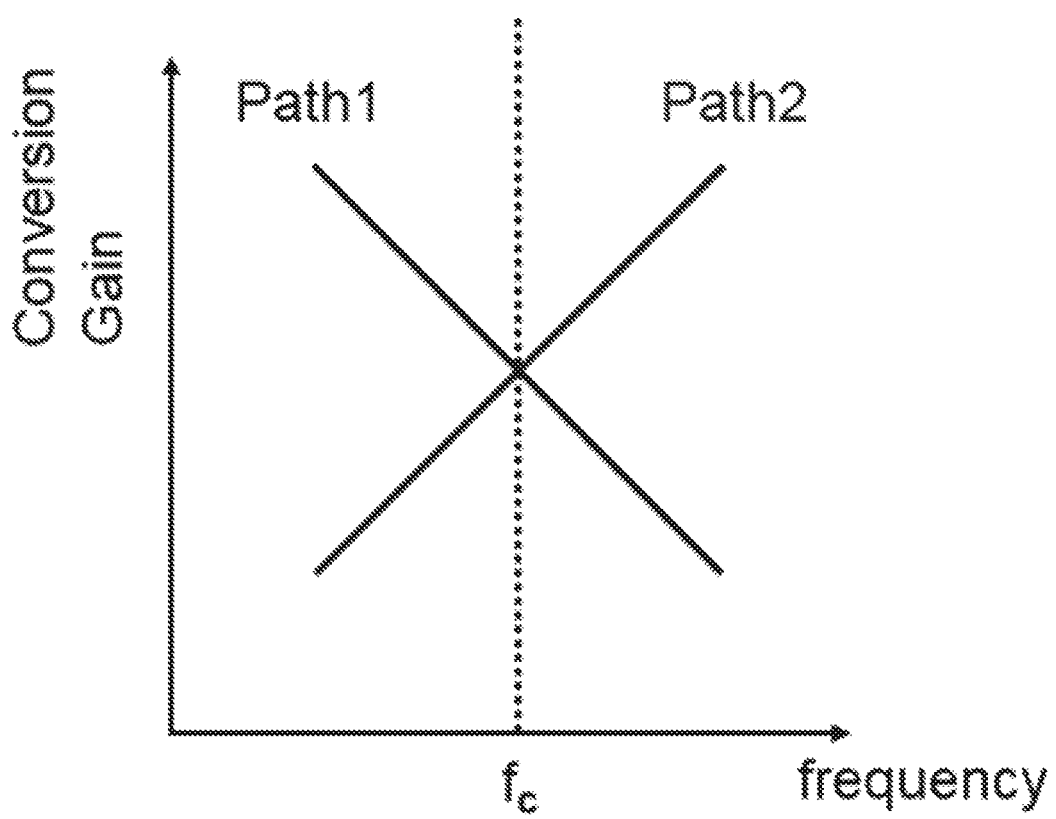
FIG. 3 illustrates the conversion gain obtained from a frequency change of the first IF path part and the second IF path part according to an embodiment of the invention.

FIG. 3 illustrates the conversion gain obtained from a frequency change of the first IF path part 240 and the second IF path part 250 according to an embodiment of the invention.

Referring to FIG. 3, the target frequency $f_C$ is the frequency at the point where the gain plot of the first IF path part 240 (Path 1) and the gain plot of the second IF path part 250 (Path 2) intersect.

If the frequency $f_{IF}$ of the IF signal output from the mixer 230 is higher than the target frequency $f_C$, then the gain of the first IF path part 240 is smaller than the gain of the second IF path part 250, so that the output of the error amplifier 260 may have a positive value. The output of the error amplifier 260 may, through the integrator 270 and the loop filter 280, provide feedback towards increasing the frequency $f_{LO}$ of the LO signal of the voltage-controlled oscillator 220. Thus, the frequency $f_{LO}$ of the LO signal may be increased, and the frequency $f_{IF}$ of the IF signal may be decreased, so that the frequency $f_{IF}$ of the IF signal may converge to the target frequency $f_C$.

Conversely, if the frequency $f_{IF}$ of the IF signal output from the mixer 230 is lower than the target frequency $f_C$, then the gain of the first IF path part 240 is greater than the gain of the second IF path part 250, so that the output of the error amplifier 260 may have a negative value. The output of the error amplifier 260 may, through the integrator 270 and the loop filter 280, provide feedback towards decreasing the frequency $f_{LO}$ of the LO signal of the voltage-controlled oscillator 220. Thus, the frequency $f_{LO}$ of the LO signal may be decreased, and the frequency $f_{IF}$ of the IF signal may be increased, so that the frequency $f_{IF}$ of the IF signal may converge to the target frequency $f_C$.

Accordingly, the frequency $f_{IF}$ of the IF signal may be locked to the target frequency $f_C$, and the frequency $f_{LO}$ of the LO signal may be locked as well. This is as expressed below in Equation 2.

$$f_{LO} = \frac{f_{RF} - f_C}{N} \qquad \text{[Equation 2]}$$

In cases where a frequency locked loop 200 according to an embodiment of the invention is implemented as a structure capable of varying the conversion gains of the first IF path part 240 and second IF path part 250, the target frequency $f_C$ can be changed, and the frequency $f_{LO}$ of the LO signal can be changed accordingly.

For example, if the gain of the first IF path part 240 is increased overall or if the gain of the second IF path part 250 is decreased overall, then the frequency of the intersection point of the gain plots of the first IF path part 240 and second IF path part 250 would be increased, so that the target frequency $f_C$ may be increased also. Conversely, if the gain of the first IF path part 240 is decreased overall or if the gain of the second IF path part 250 is increased overall, then the target frequency $f_C$ would be decreased. Variable conversion gains can be implemented by adjusting the passbands of the filters included in the first IF path part 240 and second IF path part 250 or by varying the gain of the amplifier.

Also, a trade-off between system response speed and frequency precision may be provided according to the gain of the error amplifier 260. If the gain of the error amplifier 260 is increased, the response speed of the system may be made quicker whereas the frequency precision may be decreased, but if the gain of the error amplifier 260 is decreased, the response speed of the system may become slower whereas the frequency precision may be increased. The system response speed and frequency can be adjusted by applying a structure capable of varying the gain of the error amplifier 260.

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

What is claimed is:

1. A frequency locked loop comprising:
   a voltage-controlled oscillator configured to output a local oscillator (LO) signal;
   a mixer configured to mix a radio frequency (RF) signal with the LO signal to output an intermediate frequency (IF) signal;
   a first IF path part configured to transfer the IF signal;
   a second IF path part configured to transfer the IF signal; and
   an error amplifier configured to receive output signals of the first IF path part and output signals of the second IF part as input,
   wherein the voltage-controlled oscillator adjusts a frequency of the LO signal based on an output signal of the error amplifier,
   the first IF path part has a decrease in conversion gain according to an increase in the frequency of the IF signal, and the second IF path part has an increase in conversion gain according to a decrease in the frequency of the IF signal.

2. The frequency locked loop of claim 1, wherein the first IF path part and the second IF path part are connected in parallel with respect to an output end of the mixer.

3. The frequency locked loop of claim 1, wherein the first IF path part comprises a low-pass filter (LPF), and the second IF path part comprises a high-pass filter (HPF).

4. The frequency locked loop of claim 1, wherein the first IF path part comprises an amplifier matched to a low-frequency band, and the second IF path part comprises an amplifier matched to a high-frequency band.

5. A frequency locked loop comprising:
   a voltage-controlled oscillator configured to output a local oscillator (LO) signal;
   a mixer configured to mix a radio frequency (RF) signal with the LO signal to output an intermediate frequency (IF) signal;
   a first IF path part configured to transfer the IF signal;
   a second IF path part configured to transfer the IF signal;
   an error amplifier configured to receive output signals of the first IF path part and output signals of the second IF part as input;
   an integrator configured to integrate an output signal of the error amplifier; and
   a loop filter configured to receive an output signal of the integrator as input,
   wherein an output signal of the loop filter is injected to the voltage-controlled oscillator,
   the first IF path part has a decrease in conversion gain according to an increase in the frequency of the IF signal, and the second IF path part has an increase in conversion gain according to a decrease in the frequency of the IF signal.

* * * * *